US006921699B2

(12) United States Patent
Ma et al.

(10) Patent No.: US 6,921,699 B2
(45) Date of Patent: Jul. 26, 2005

(54) METHOD FOR MANUFACTURING A SEMICONDUCTOR DEVICE WITH A TRENCH TERMINATION

(75) Inventors: Ling Ma, Los Angeles, CA (US); Adam Amali, Hawthorne, CA (US); Siddharth Kiyawat, El Segundo, CA (US); Ashita Mirchandani, El Segundo, CA (US); Donald He, Redondo Beach, CA (US); Naresh Thapar, Los Angeles, CA (US); Ritu Sodhi, Redondo Beach, CA (US); Kyle Spring, Temecula, CA (US); Daniel Kinzer, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/674,444

(22) Filed: Sep. 29, 2003

(65) Prior Publication Data

US 2004/0137684 A1 Jul. 15, 2004

Related U.S. Application Data

(60) Provisional application No. 60/415,302, filed on Sep. 30, 2002, and provisional application No. 60/444,064, filed on Jan. 29, 2003.

(51) Int. Cl.[7] .............................................. H01L 21/36
(52) U.S. Cl. ....................................... 438/270; 438/700
(58) Field of Search ................................. 438/270, 700

(56) References Cited

U.S. PATENT DOCUMENTS

| 5,082,795 | A | * | 1/1992 | Temple ........................ 438/138 |
| 5,298,442 | A | * | 3/1994 | Bulucea et al. ............. 438/270 |
| 5,637,898 | A | | 6/1997 | Baliga |
| 5,998,833 | A | | 12/1999 | Baliga |
| 6,001,678 | A | | 12/1999 | Takahashi |
| 6,163,052 | A | | 12/2000 | Liu et al. |
| 6,297,101 | B1 | | 10/2001 | Schaeffer |
| 6,331,466 | B1 | | 12/2001 | Takahashi et al. |
| 6,388,286 | B1 | | 5/2002 | Baliga |
| 6,489,204 | B1 | * | 12/2002 | Tsui ............................ 438/270 |
| 6,621,121 | B2 | | 9/2003 | Baliga |
| 6,660,591 | B2 | * | 12/2003 | Peake et al. ................. 438/270 |
| 6,707,100 | B2 | * | 3/2004 | Gajda .......................... 257/300 |
| 2002/0009854 | A1 | * | 1/2002 | Hshieh et al. .............. 438/270 |
| 2002/0160572 | A1 | * | 10/2002 | Lee ............................. 438/270 |
| 2002/0167046 | A1 | | 11/2002 | Aoki et al. |

* cited by examiner

Primary Examiner—W. David Coleman
(74) Attorney, Agent, or Firm—Ostrolenk, Faber, Gerb & Soffen, LLP

(57) ABSTRACT

A process for manufacturing a semiconductor device of the trench variety with reduced feature sizes and improved characteristics which process includes forming a termination structure having a field oxide disposed in a recess below the surface of the semiconductor die in which the active elements of the device are formed, and forming source regions after the major thermal steps have been performed.

20 Claims, 15 Drawing Sheets

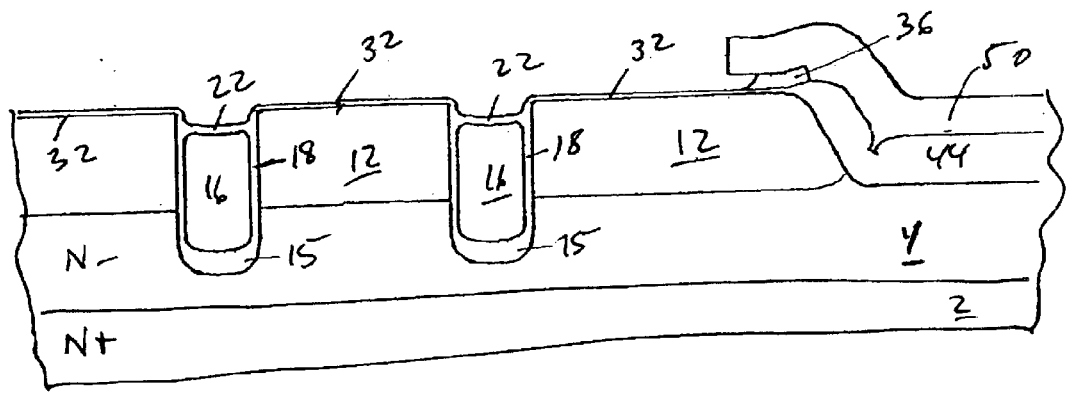
Figure 24
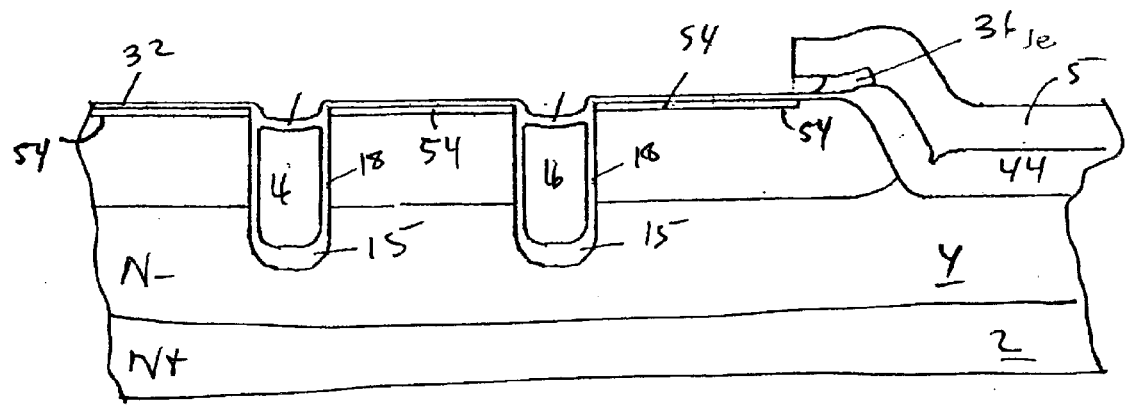
20

METHOD FOR MANUFACTURING A SEMICONDUCTOR DEVICE WITH A TRENCH TERMINATION

RELATED APPLICATIONS

The application is based on and claims benefit of U.S. Provisional Application No. 60/415,302, filed on Sep. 30, 2002, entitled Self-Aligned Late Source with Photo Defined Contact Trench MOSFET, and U.S. Provisional Application No. 60/444,064, filed on Jan. 29, 2003, entitled Trench MOSFET Technology for DC—DC Converter Applications, to which claims of priority are hereby made.

BACKGROUND AND SUMMARY OF THE INVENTION

The ever increasing demands for more efficient power supplies and longer lasting battery-powered electronic devices have made efficiency in power management systems one of the most challenging areas for engineers. Thus, improving the characteristics of discrete power devices, such as power MOSFETs, which are used in power management systems, continue to push manufacturers to produce devices with lower ON-resistance, lower gate charge and higher current capability.

A process according to the present invention significantly reduces the size of the features in a power device, resulting in reduced ON-resistance, reduced gate charge, and increased current carrying capability. As a result, a device, such as a power MOSFET, produced according to the present invention can be used in high frequency, e.g. 1 MHz, applications without undue heat generation. Thus, devices produced according to the present invention exhibit improved characteristics for power conversion.

A power MOSFET produced according to an embodiment of the present invention is of a trench variety, in which the active region includes a plurality of trenches each supporting a gate structure and each formed in an epitaxial layer that is grown over a monolithic semiconductor substrate. Disposed around the active region of the device is a termination structure. The termination structure is formed in a recess around the active region and includes a layer of field oxide disposed on the surfaces of the recess, a conductive layer disposed on the field oxide and a low temperature oxide formed over the conductive layer. A contact layer may be formed over the low temperature oxide and connected to the conductive layer of the termination structure through the low temperature oxide.

The termination structure can significantly reduce the electrical field crowding at termination, thus eliminating the need for implanted guard rings without compromising the device breakdown voltage and ruggedness. Typical avalanche energy measured for this termination structure has been 1 J for a die in a DPAK.

The field oxide in the termination structure is grown using, for example, LOCOS process after the termination recess has been etched. Because the field oxide is below the top surface of the die, wafer planarity at active trench lithography stage is improved greatly. The much improved wafer surface planarity at trench lithography stage allows for further reduction of trench width by as much as 20%. This reduction in size makes it possible to, for example, increase the density of the trenches thus increasing channel density while keeping the gate charge low, especially the $Q_{GD}$ and $Q_{SWITCH}$. To add to the performance of the device the depth of the channels may also be reduced.

A process according to the present invention includes forming source regions after high temperature steps have been carried out. As a result, the dimensions of the source regions can be minimized which allows for a reduction in the depth of the channel region and thus shorter channels in the device. The shorter channels in turn improve the ON-resistance of the device. In addition, shorter channels require a thinner epitaxial layer, as compared to prior art devices, thus reducing the cost of the device as well as further reducing the ON-resistance by shortening the common conduction region of the device.

A process according to the present invention include the following features: defining the termination recess and active area trenches with a nitride hard mask; implanting the channel dopants through a screen oxide into the epitaxial layer; forming a thick oxide at the bottom of the active area trenches; and source formation after formation of gate structures.

Other features and advantages of the present invention will become apparent from the following description of the invention which refers to the accompanying drawings.

BRIEF DESCRIPTION OF THE DRAWINGS

FIG. 1b shows a cross-sectional view of a portion of an alternative embodiment of a semiconductor device according to the present invention.

DETAILED DESCRIPTION OF EMBODIMENTS OF THE INVENTION

Figure 1A:
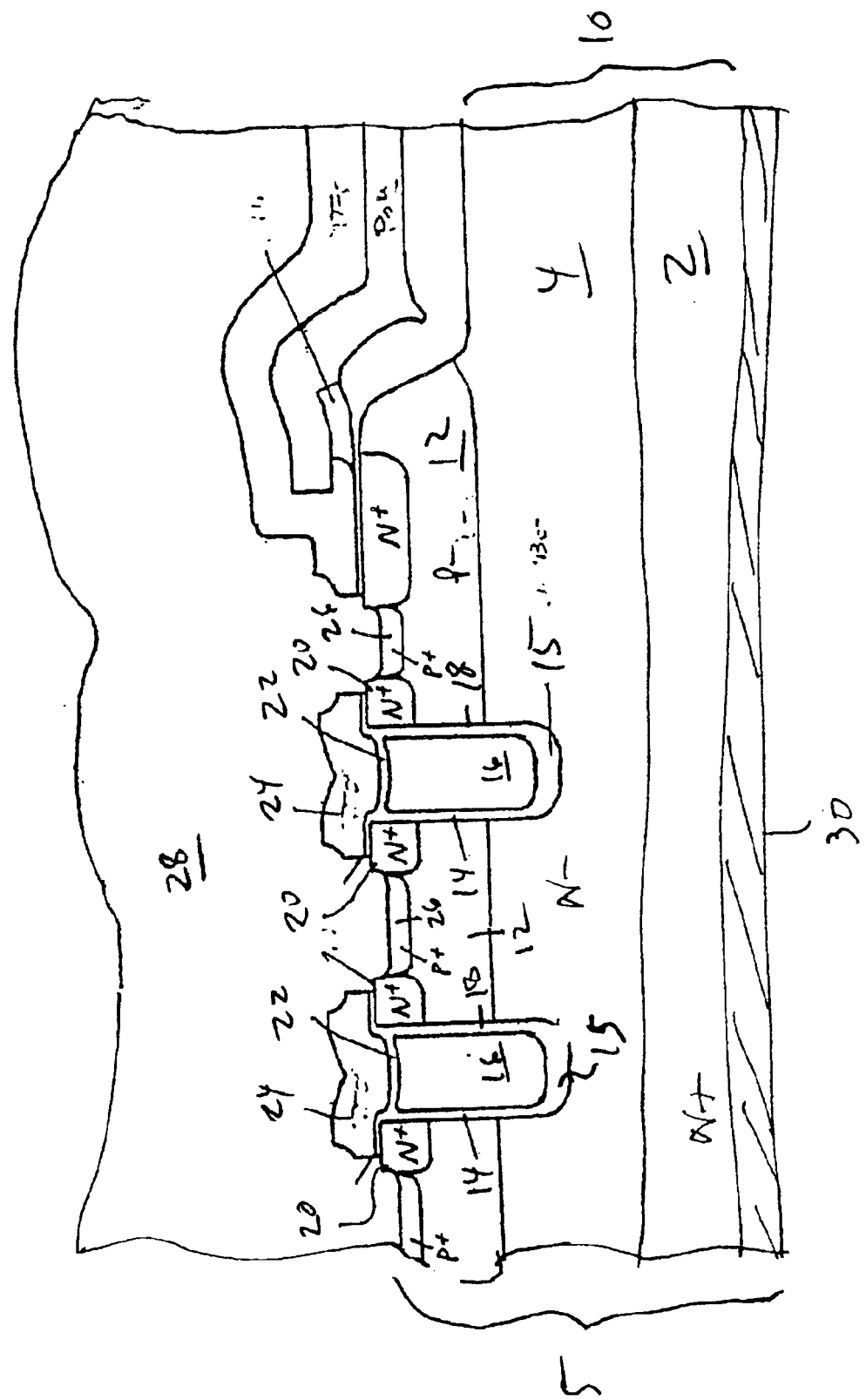
FIG. 1a shows a cross-sectional view of a portion of a semiconductor device according to the present invention.
Figure 16:
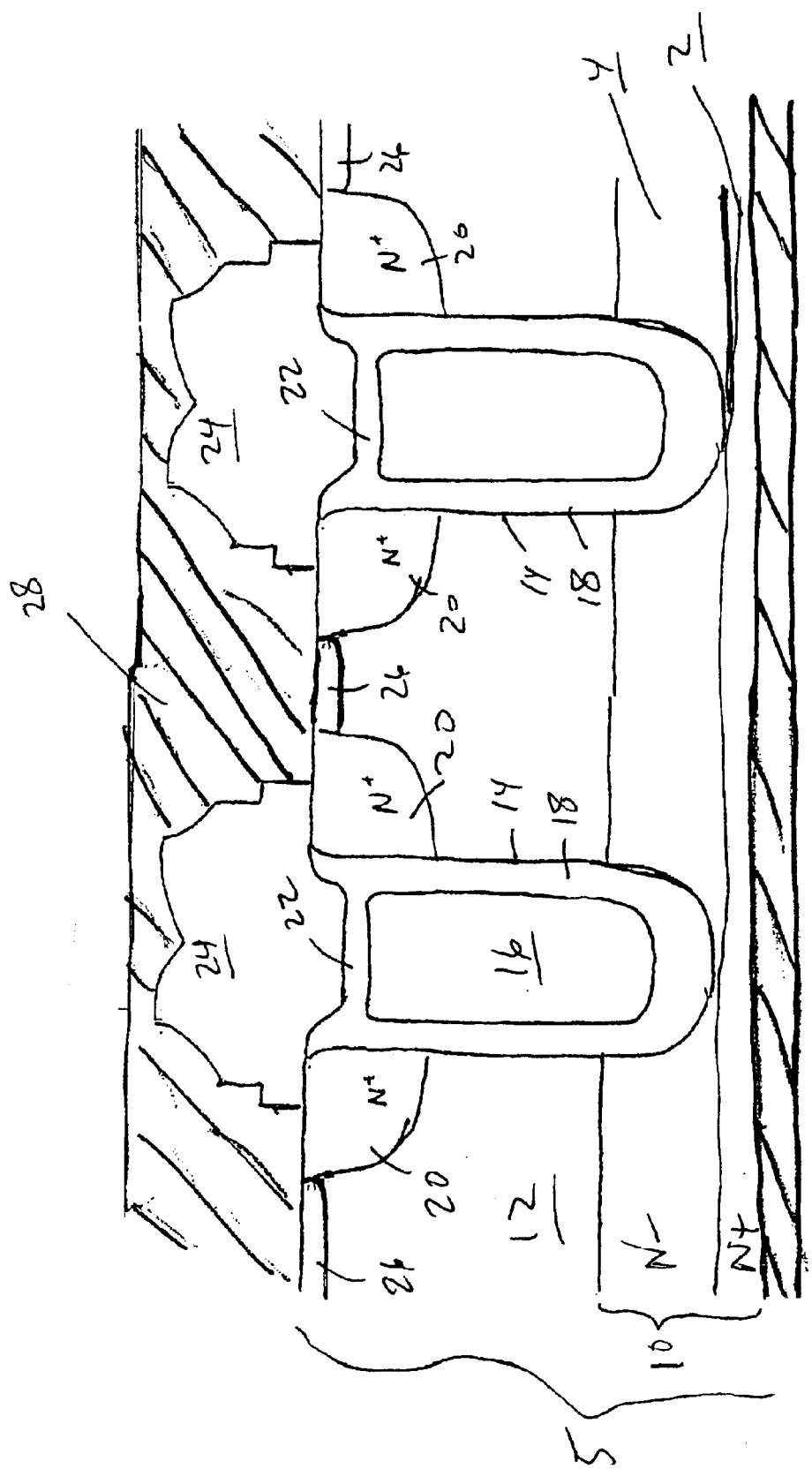

Referring to FIG. 1a, a semiconductor device according to the present invention is formed in silicon die 5 which includes drain region 10 of a first conductivity type, and channel region 12, which is lightly doped with dopants of a conductivity type that is opposite to those of drain region 10. A semiconductor device according to the present invention includes a plurality of trenches 14 extending from the top surface of die 5 to drain region 10. Trenches 14 have disposed therein conductive material such as doped polysilicon to form gate electrode 16. Gate electrodes 16 are electronically insulated from channel region 12 by oxide 18. Oxide 18 is formed at the side walls of each trench 14. It should be noted that a thick oxide 15 is formed at the bottom of each trench. A semiconductor device according to the present invention also includes self-aligned source regions 20 which are disposed on opposite sides of each trench 14 and extend to a predetermined depth less than the thickness of channel region 12. Self-aligned source regions 20 are doped with dopants of the same conductivity as drain region 10.

Each gate electrode 16 has disposed on the top surface thereof gate isolation layer 22. Disposed on the top surface of each gate isolation 22 is a layer of low temperature insulation material 24. Adjacent each source region 20, extending from the top surface of channel region 12, preferably to a depth that is less than the depth of an adjacent source region 20, is a highly doped contact region 26 which is doped with dopants of the same conductivity as those in channel region 12. Highly doped contact regions 26 are formed on the bottom of depressions on the top surface of die 5. Source contact layer 28, which is typically composed of an aluminum alloy, is disposed over the top surface of die 5 in ohmic contact with source regions 20 and contact regions 26 thereby shorting source regions 20 and contact regions 26. Drain contact layer 30, which may be composed of trimetal or some other suitable solderable contact metal, is disposed on the free surface of die 5 opposite to source contact layer 28 and in ohmic contact with drain region 10.

In a semiconductor device according to the second embodiment, as shown by FIG. 1b, highly doped contact regions 26 are formed on the top surface of die 5.

FIGS. 1a and 1b only show a portion of a semiconductor device produced according to the present invention. One skilled in the art would understand that in an actual semiconductor device the active region would include a greater number of trenches 14.

The semiconductor devices shown by FIGS. 1a and 1b are of the trench variety. A trench type device is operated by applying voltage to its gate electrodes 16 in order to invert the regions immediately adjacent oxide 18, thus electrically connecting its source regions 20 to its drain region 10. The semiconductor devices shown by FIGS. 1a and 1b are N-channel devices. By reversing the polarities of the dopants in each region, a P-channel device may be obtained in each case.

Die 5 in the preferred embodiment is comprised of a monolithic silicon substrate 2 which has an epitaxial layer formed over its top surface. Trenches 14 as described above are formed in epitaxial layer. Drain region 10 as described herein refers to drift region 4 which is disposed between substrate 2 and channel region 12. A skilled person in the art would recognize that semiconductor die of other material or structure may be used without deviating from the present invention.

A semiconductor device such as the one shown by FIG. 1a is manufactured according to the following process.

Figure 2A:
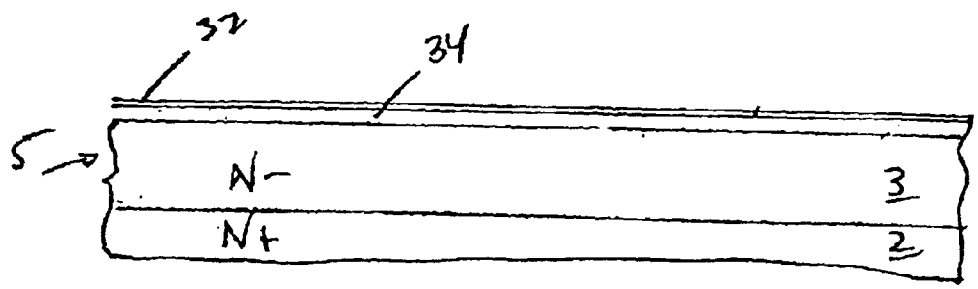
FIGS. 2a–2u illustrate a process according to the present invention.

Referring first to FIG. 2a, initially a layer of pad oxide 32 is formed atop epitaxial layer 3 of silicon die 5, which is doped with dopants of a first conductivity type. In the example shown, the dopants of the first conductivity type are N-type dopants. Dopants of a conductivity type opposite to those of the first conductivity type (P-type) are then implanted through pad oxide 32 to form shallow channel implant region 34 that is to become channel region 12 (FIG. 1) as will be described later.

Figure 2B:
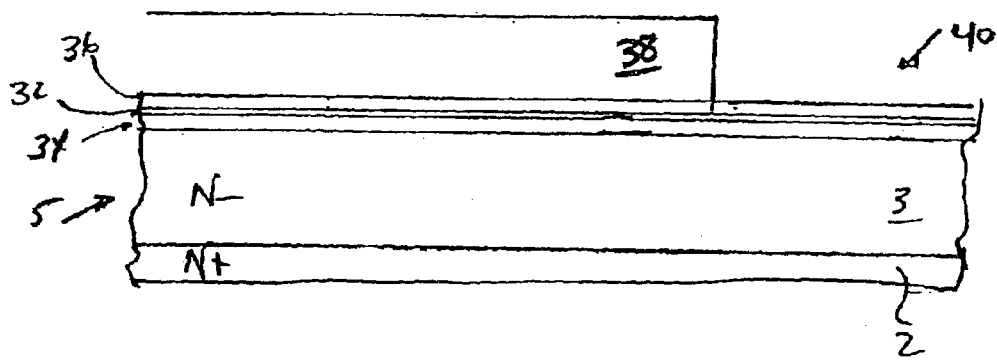
Figure 2C:
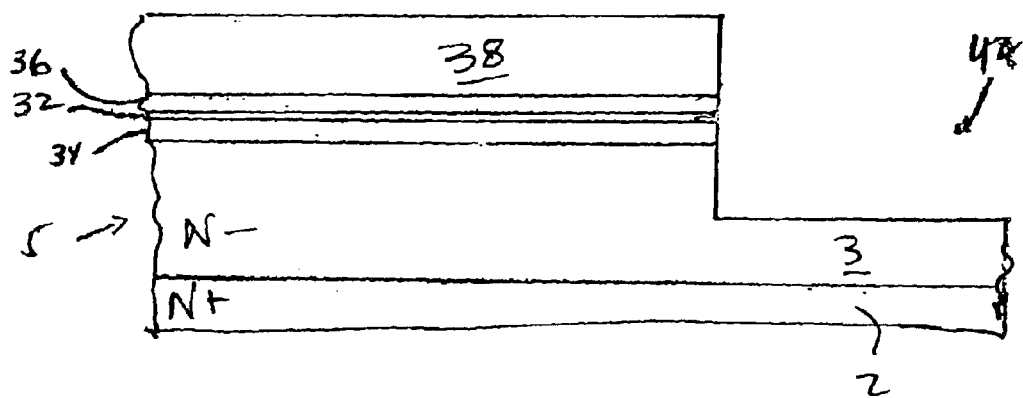
Figure 2D:
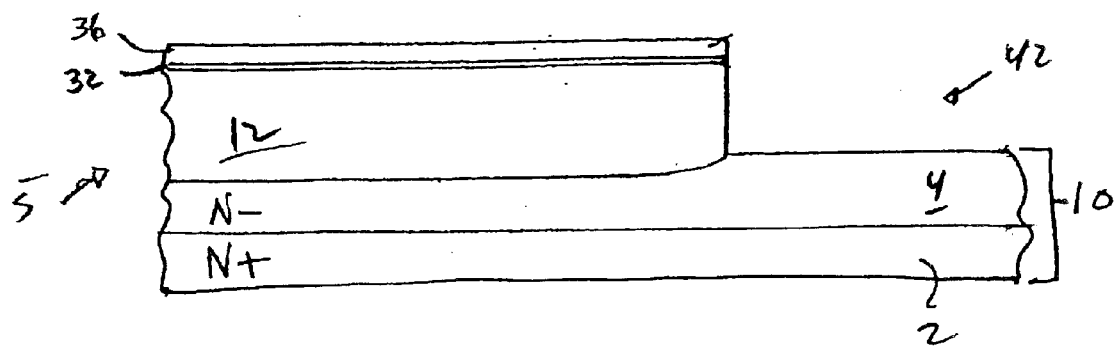

Referring next to FIG. 2b, nitride layer 36 is deposited atop pad oxide 32. An active mask comprising a layer of photoresist 38 is deposited over a substantial portion of nitride layer 36 leaving only termination region 40 exposed. Next, as shown in FIG. 2c, using photoresist 38 as a mask, termination recess 42 is formed by, for example, conventionally known dry etching techniques or some other suitable etching method. Photoresist 38 is then removed and the dopants in shallow channel implant region 34 are driven in a diffusion drive to form channel region 12 as shown in FIG. 2d. It should be noted that although not shown, termination recess 42 is disposed around the active region of the device.

Figure 2E:
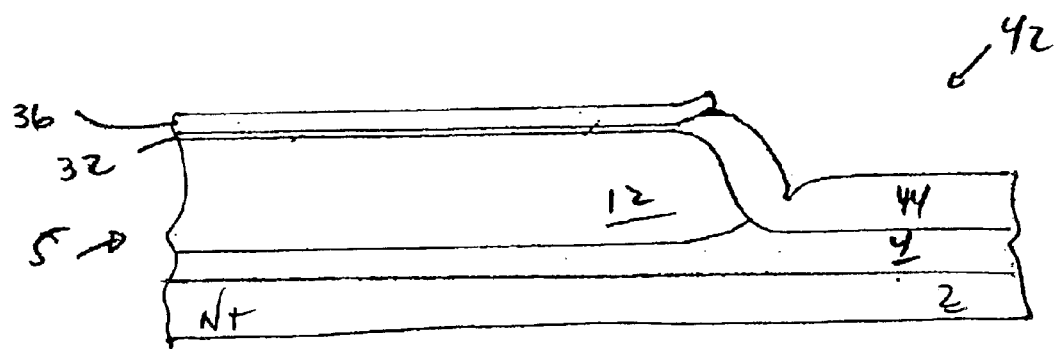

Referring next to FIG. 2e, field oxide 44 is formed in termination recess 42 thereby providing a recessed field oxide termination structure.

Figure 2F:
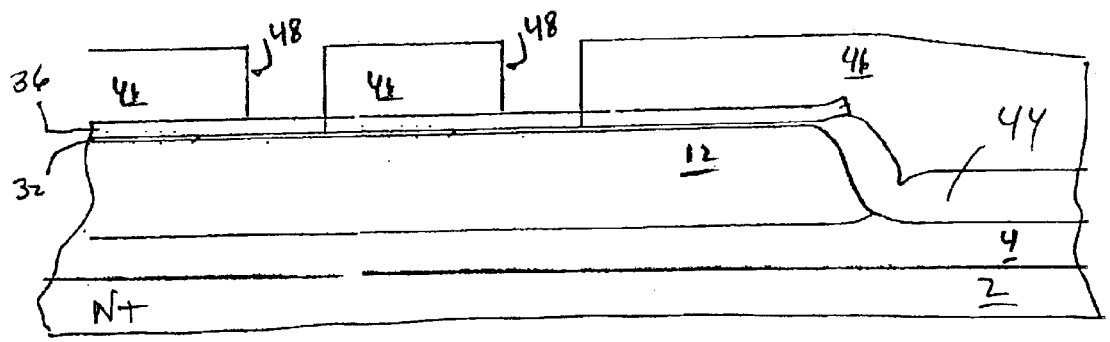
Figure 2G:
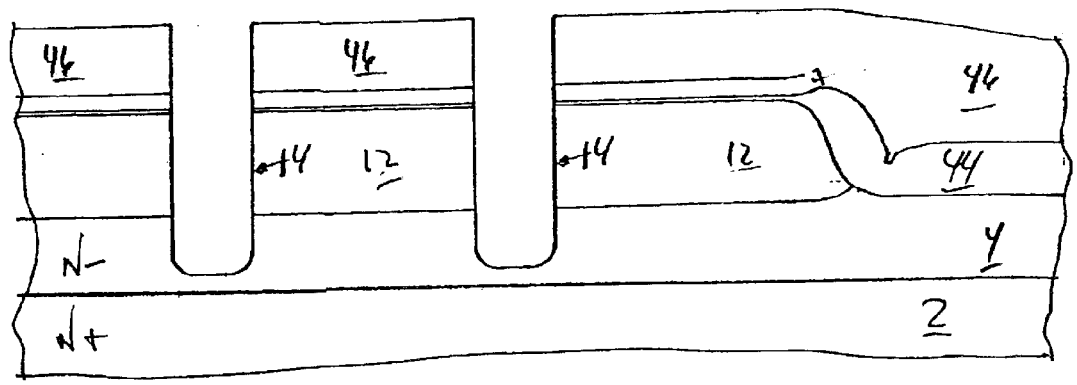

Referring next to FIG. 2f, trench mask 46 is deposited over the top surface of nitride 36 and field oxide 44. Trench mask 46 includes openings 48 to identify the positions of trenches 14 (FIG. 1) that are to be formed in die 5. Next, trenches 14 are formed in the body of die 5 in the positions identified by openings 48 as shown in FIG. 2g. Trenches 14 are formed by dry etching and extend from the top surface of die 5, through channel region 12 to a predetermined depth in drift region 4. It should be noted that it is also possible to extend trenches 14 below drift region 4. It should also be noted that the trenches 14 may be in the form of parallel stripes, hexagonal or some other form, although stripes are preferred in that stripes may further reduce ON-resistance.

Figure 2H:
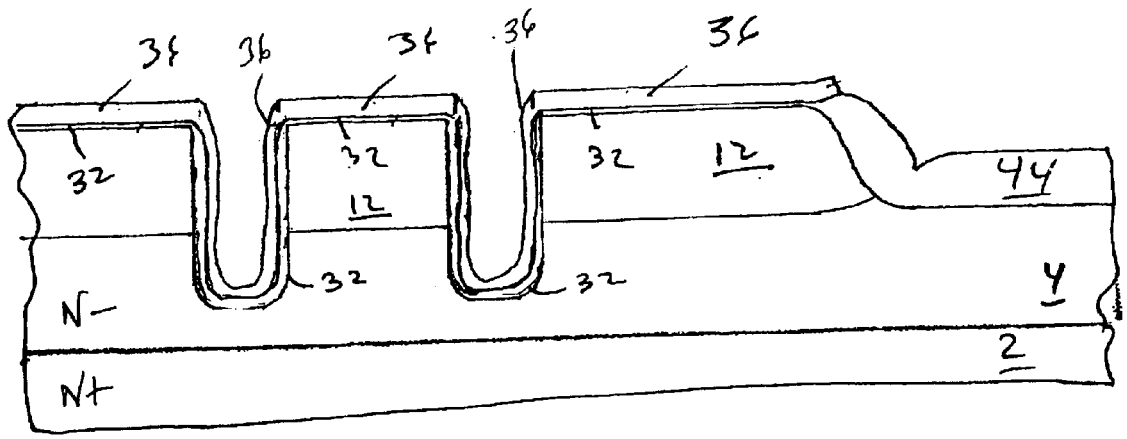

After the formation of trenches 14, a layer of sacrificial oxide is grown on the sidewalls and bottom of trenches 14 and then etched. Thereafter, trench mask 46 is removed. Next, pad oxide 32 is formed into trenches 14 as shown in FIG. 2h. Referring again to FIG. 2h, nitride layer 36 is extended over pad oxide 32 inside trenches 14 by deposition of a nitride layer.

Figure 2I:
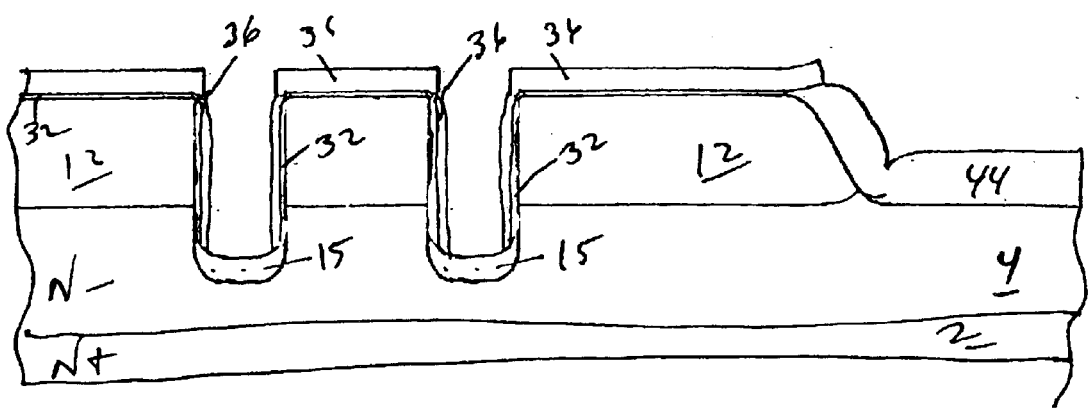

Referring to FIG. 2i, the portion of nitride 36 that is disposed at the bottom of each trench 14 is then removed by, for example, dry etching and thick oxide 15 is grown at the bottom of each trench 14. Nitride 36 disposed on the sidewalls of each trench 14 is an oxidation retardant which prevents the growth of oxide on the sidewalls of trenches 14 while allowing the growth of a thick oxide layer at the bottom of each trench. As a result, the sidewalls of each trench 14 may be covered with a very thin oxide layer, while its bottom will be fully insulated because of thick oxide 15.

Figure 2J:
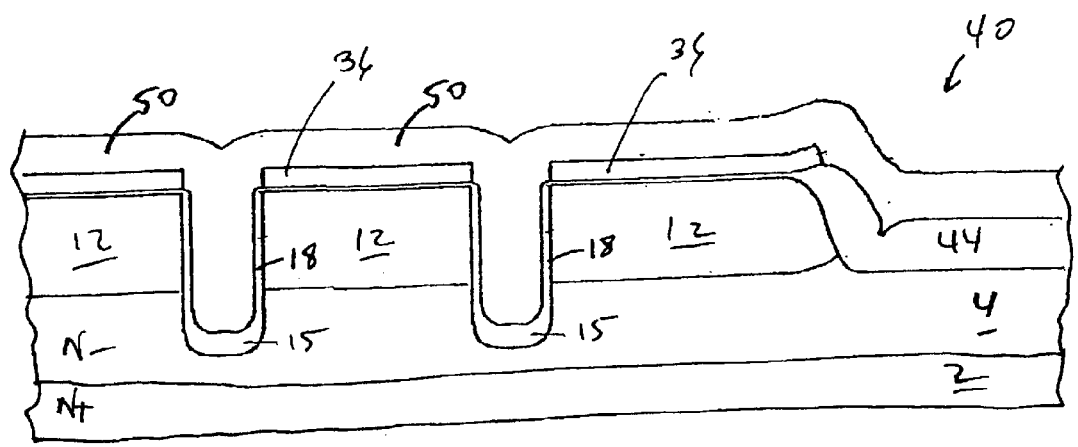

Next, as shown in FIG. 2j, portions of nitride 36 that cover sidewalls of trenches 14 are removed through, for example, wet etching and, gate oxide layer 18 is grown inside each trench 14. Then, a layer of polysilicon 50 is deposited such that trenches 14 are filled with polysilicon.

Figure 2K:
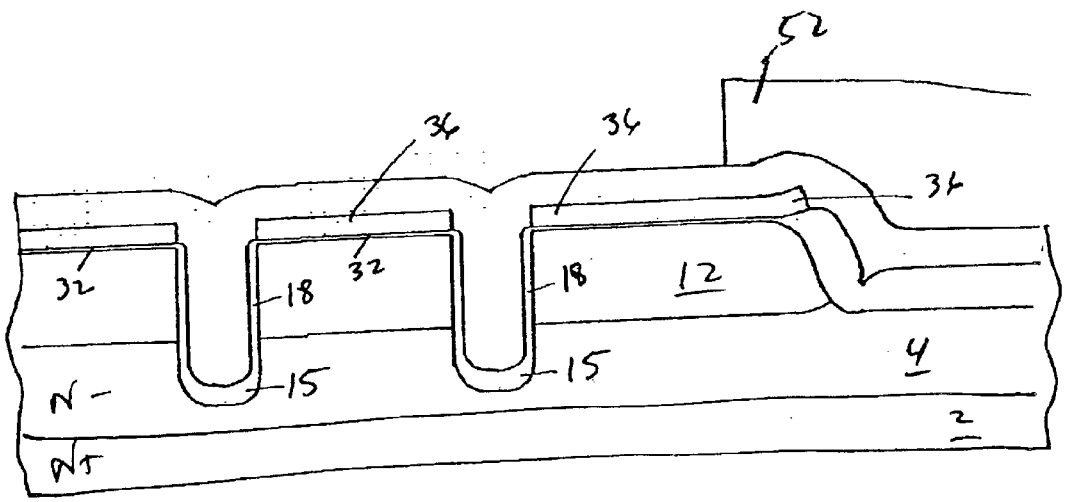
Figure 2L:
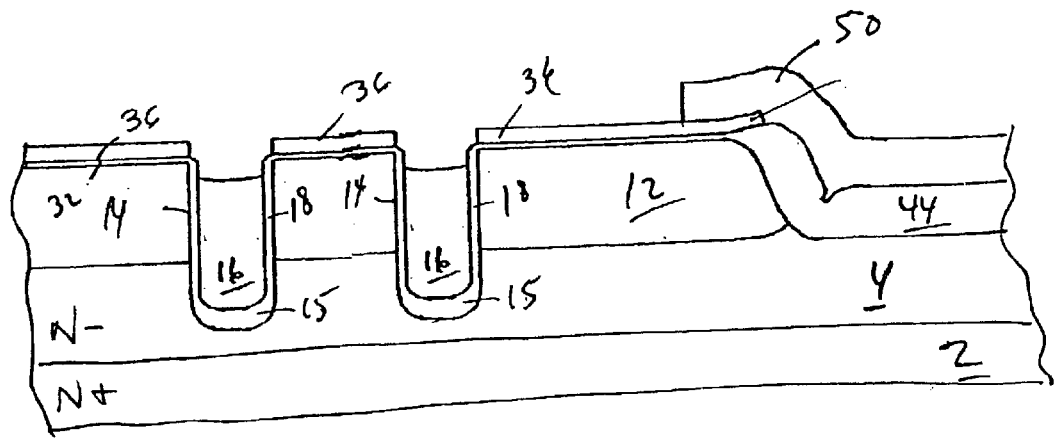

Referring next to FIG. 2k, polysilicon mask 52 is formed to cover at least termination region 40. Next, to form gate electrodes 16, polysilicon layer 50 is etched such that inside each trench 14 there will be a polysilicon body that extends between its bottom to a position above channel region 12. As a result, a layer of polysilicon 50 will be left under polysilicon mask 52, which will then become part of the termination structure of the device as shown in FIG. 2l.

Figure 2M:
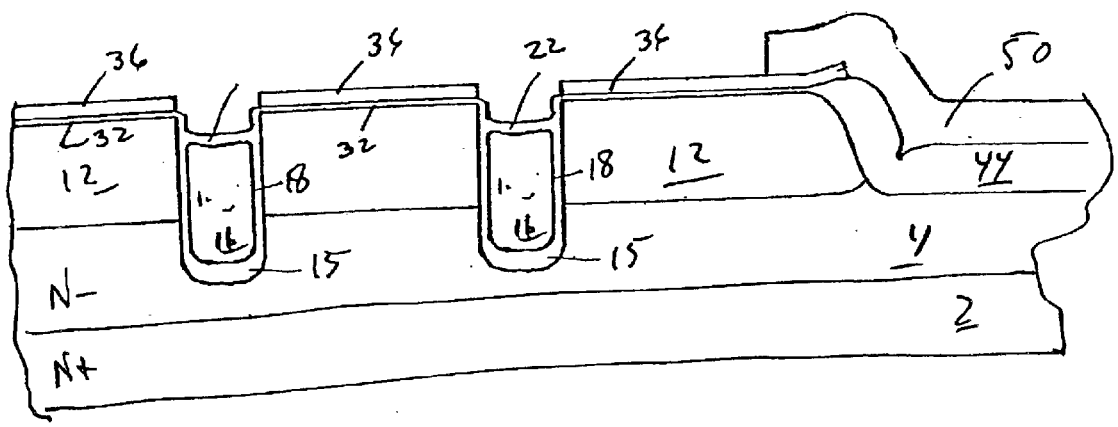

Referring next to FIG. 2m, the top surface of gate electrode 16 in each trench 14 is oxidized by, for example, thermal oxidation to form isolation layer 22. Then, substantially all of nitride 36 is removed by, for example, wet etching to leave behind only small portions of nitride 36 near the termination structure of the semiconductor device as shown by FIG. 2n.

Figure 2P:
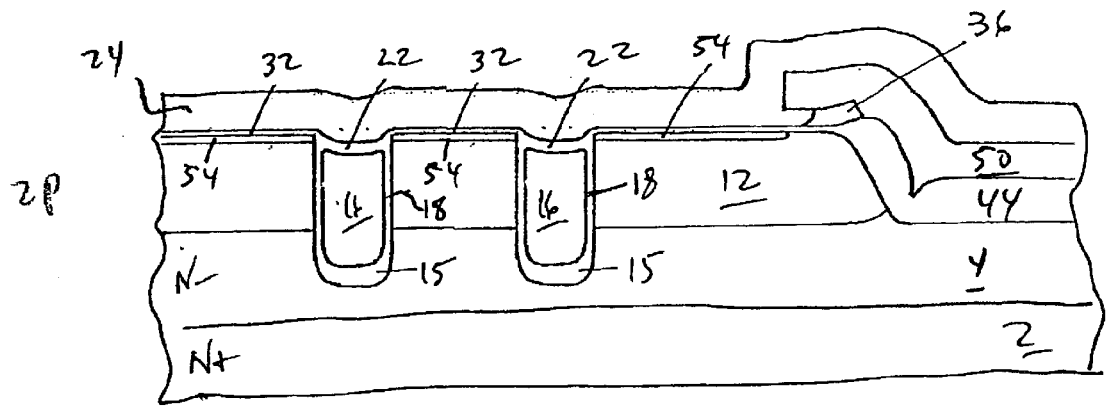

Following the substantial removal of nitride layer 36, dopants for formation of source regions 20 are implanted to form source implant region 54 as shown in FIG. 2o. The formation of source implant region 54 is then followed by the deposition of a layer of low temperature oxide 24 over the entire top surface of die 5 as shown in FIG. 2p. It should be noted that source implant region 54 is formed after the thermal oxidation of polysilicon to form isolation layer 22. By implanting source dopants after the thermal oxidation process, the final depth of source regions 20 can be kept to a minimum. As a result, the depth of channel region 12, and also thickness of epitaxial layer 3 can be minimized, thereby reducing the ON-resistance of the device by both shortening the channels, and reducing the thickness of the drift region 4 in the device.

Figure 2Q:
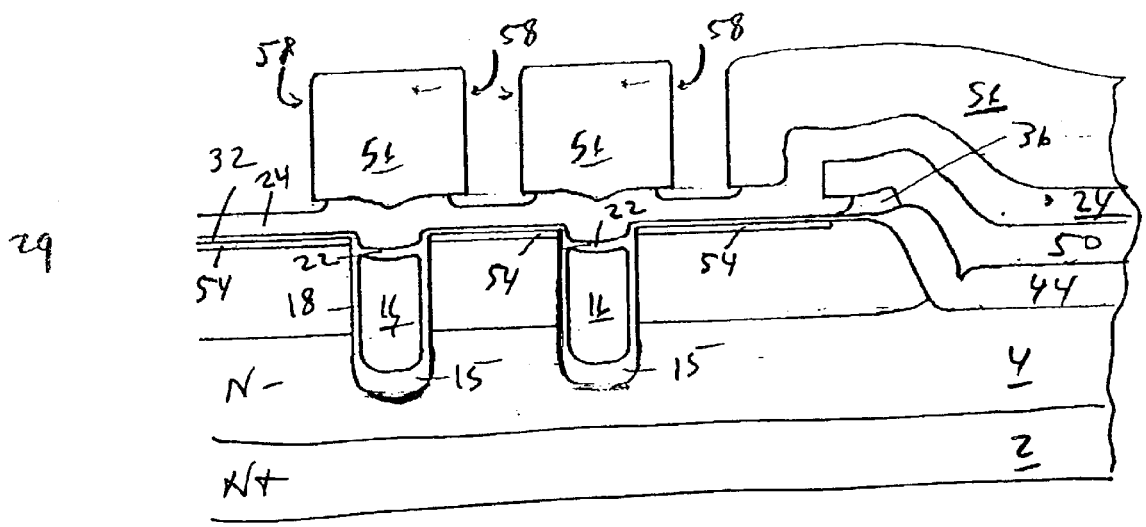
Figure 2R:
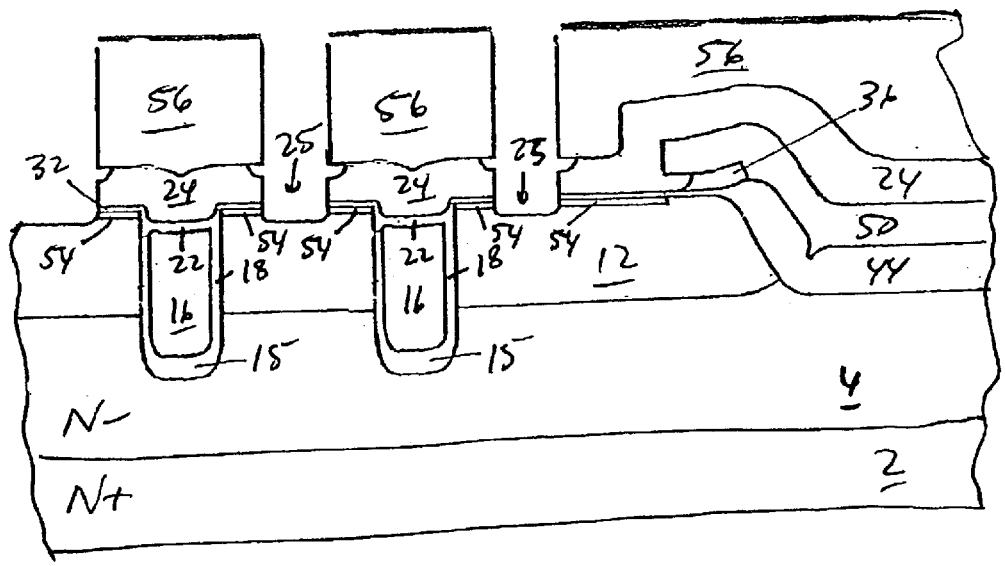

Next, source contact mask 56 is formed over low temperature oxide 24 as shown in FIG. 2q. Source contact mask 56 is formed by patterning a photoresist layer in a known manner to include openings 58. Openings 58 are first used to taper etch portions of low temperature oxide layer 24 such that the etched area extends laterally under source contact mask 56 and vertically to a depth that is less than the thickness of low temperature oxide 24. Then, using openings 58 in source contact mask 56 etching is continued vertically to create depressions 25 that extend to a depth below source implant region 54 as shown in FIG. 2r. The initial taper etching improves step coverage once the source contact is formed.

Figure 2S:
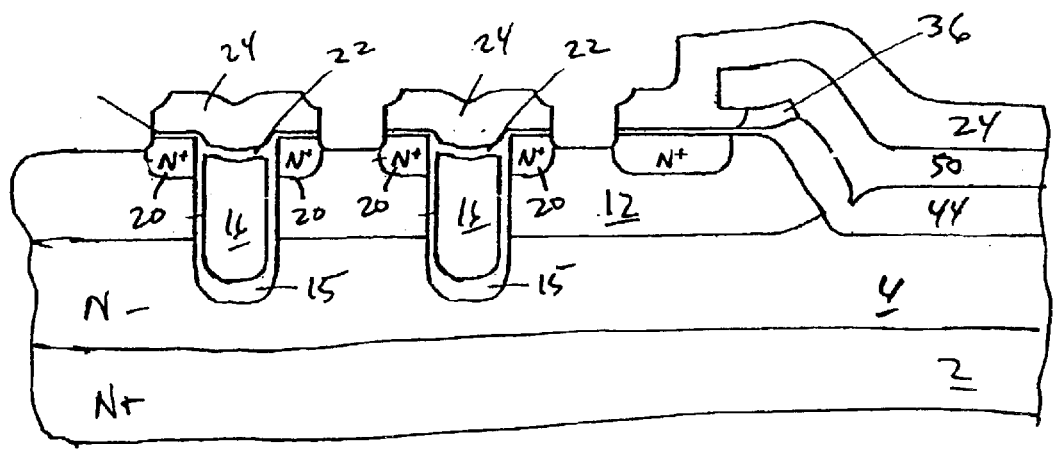
Figure 2F:
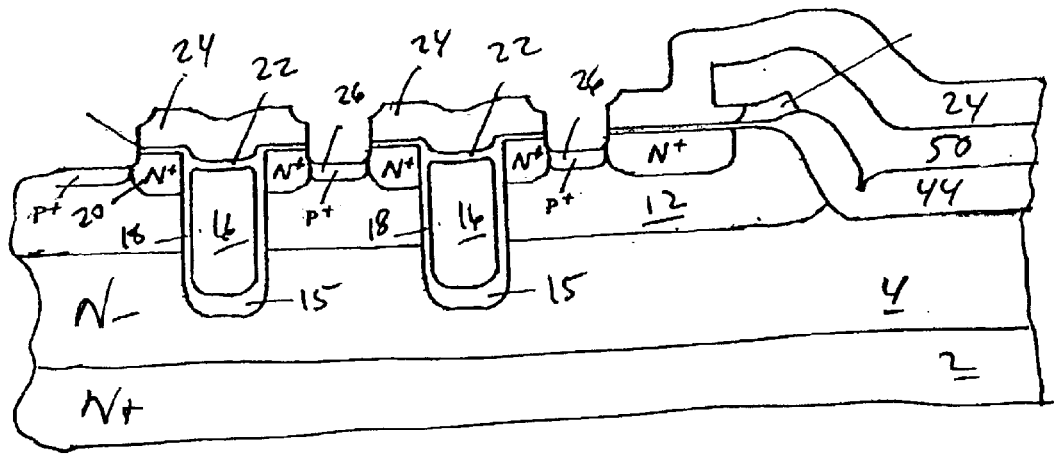
Figure 2G:
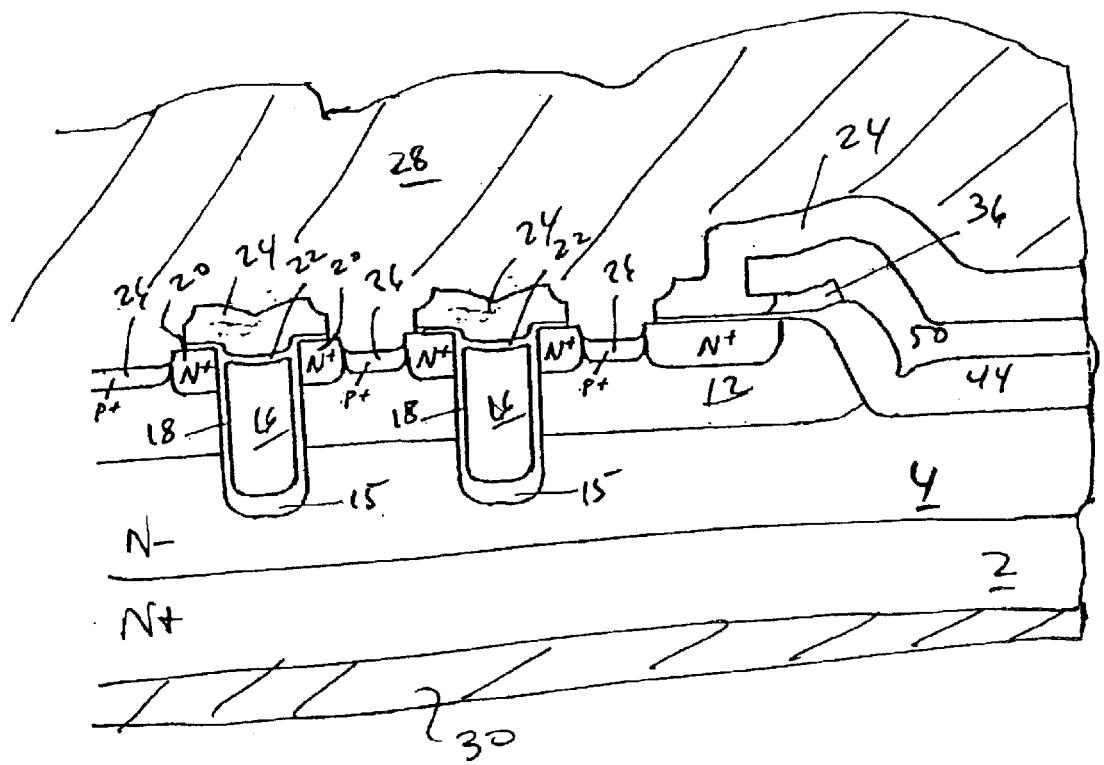

Next, source contact mask 56 is removed and the dopants in the source implant region 54 are subjected to a diffusion drive to form source regions 20 as shown by FIG. 2s. After the source diffusion drive, highly doped contact regions 26, as shown in FIG. 2t, are formed between source regions 20 through an implant step using low temperature oxide 24 as a mask followed by a diffusion drive. Low temperature oxide 24 may be then etched back to expose portions of source regions 20 at the top surface of die 5

Next, source contact 28 is deposited over the top surface of die 5 and drain contact 30 is formed on the bottom surface of die 5 as shown by FIG. 2u. In addition to the foregoing steps, conventionally known steps may be carried out before or after the formation of source contact 28 to form a gate contact structure (not shown) on the top surface of die 5.

A semiconductor device having self-aligned source regions as shown in FIG. 1b may be processed according to the following.

Figure 3A:
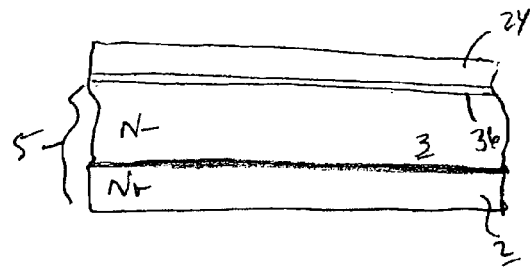
FIGS. 3a–3h illustrate a process according to an alternative embodiment of the present invention.

Referring to FIG. 3a, after the channel implant step which was described in reference to FIG. 2a, nitride 36 is formed over the top surface of die 5. Then, a layer of low temperature oxide 24 is formed over nitride layer 36. Nitride 36 may be about 500 Å thick, and low temperature oxide 24 may be about 3000 Å thick.

Figure 3B:
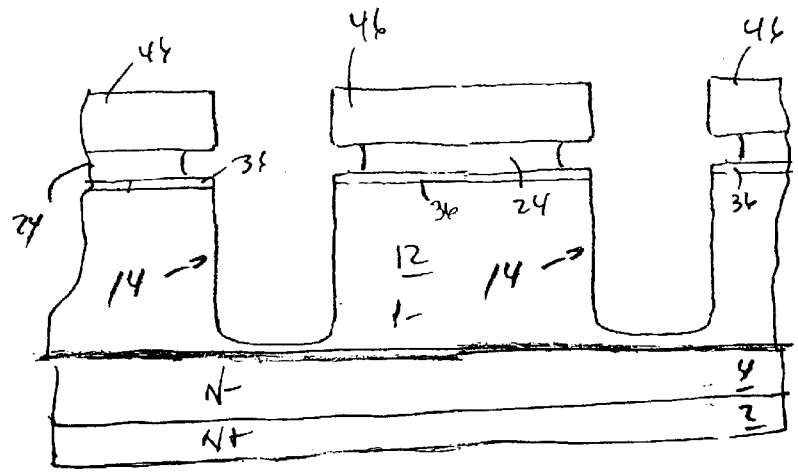

Referring next to FIG. 3b, trench mask 46 is deposited over low temperature oxide 24 and trenches 14 are formed in die 5 as described earlier with reference to FIGS. 2f and 2g. According to an aspect of the invention, low temperature oxide 24 is etched back from the edges of trenches 14 exposing portions of the top surface of nitride layer 36 that is disposed between the edges of trenches 14 and low temperature oxide 24 layer.

Figure 3C:
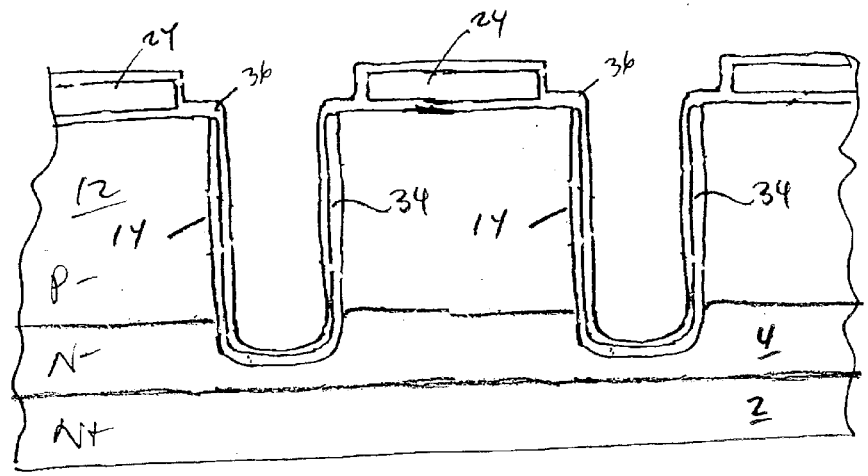

Referring next to FIG. 3c, trench mask 46 is removed, and then pad oxide 34 is formed over die 5 including the walls and the bottom of trenches 14. Pad oxide 34 may be about 240 Å. Next, nitride 36 is deposited over pad oxide 34. Nitride 36 may be about 200 Å thick.

Figure 3D:
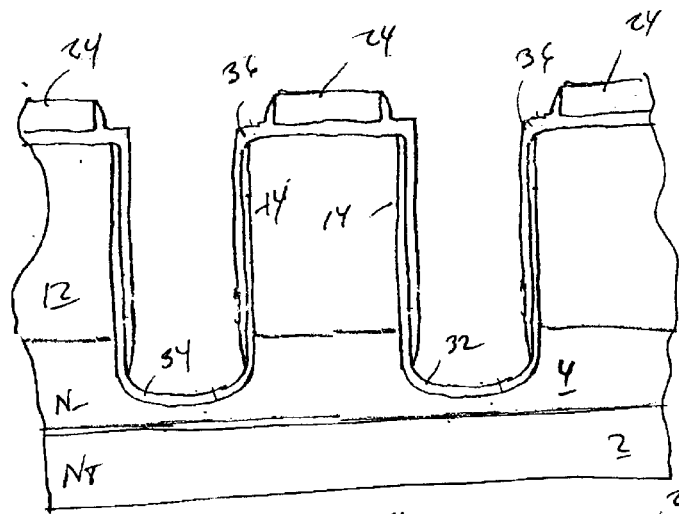
Figure 3E:
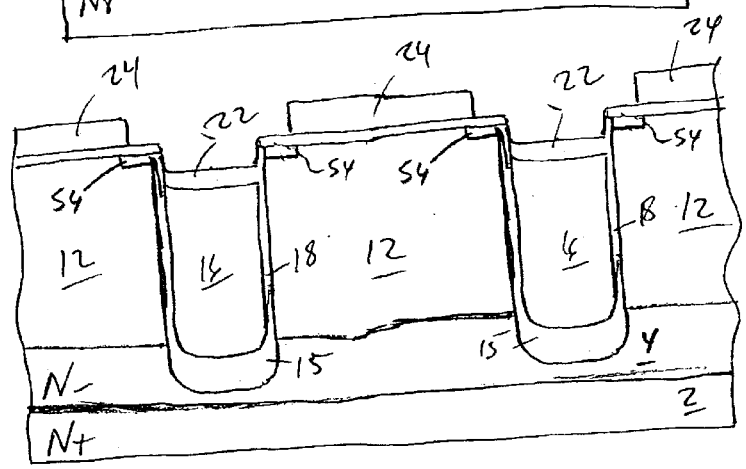
Figure 3F:
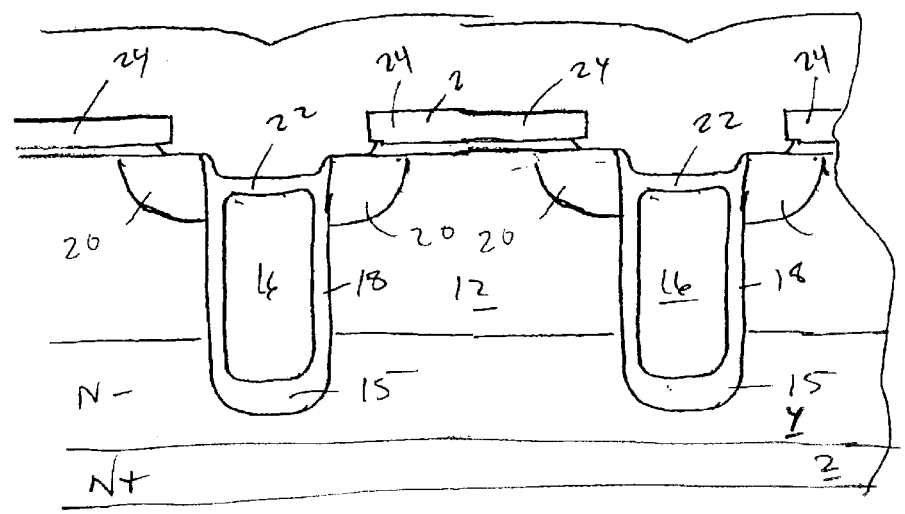

Referring next to FIG. 3d, nitride 36 is then removed from the top of low temperature oxide 24 and the bottom of trenches 14 by etching. The bottom of each trench 14 is then oxidized and gate electrode 16 and gate isolation layer 22 are formed as previously described with reference to FIGS. 2i–2m to obtain the structure shown in FIG. 3e. It should be noted that due to the etch back described above with reference to FIG. 3b, shoulders are formed adjacent to the top edges of each trench 14. Using the opening in low temperature oxide 24 as a mask dopants are implanted through the shoulders that are adjacent to the top edges of trenches 14 to form source implant regions 54. Next, the dopants in source implant regions 54 are driven in a diffusion drive to form source regions 20 as shown in FIG. 3f. Thereafter, another low temperature oxide 24 layer is formed over the top surface of die 5.

Figure 3G:
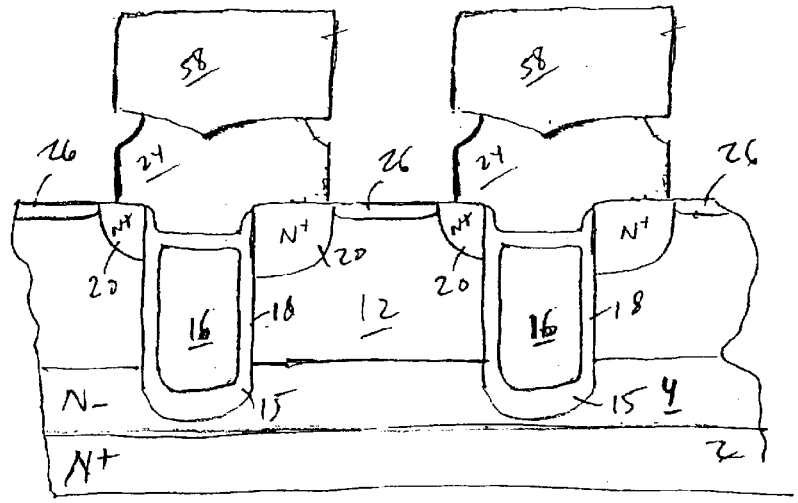
Figure 3H:
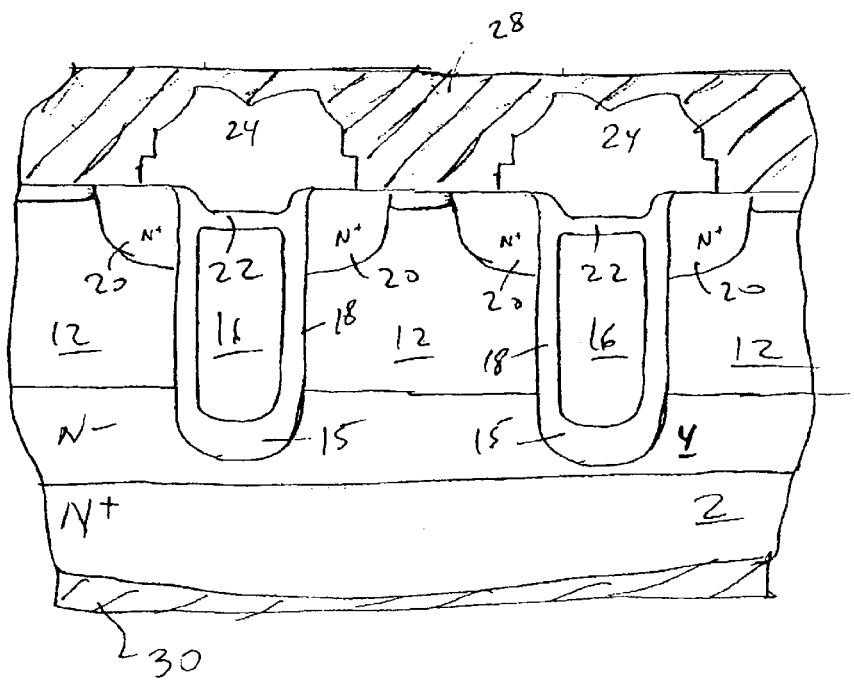

Referring next to FIG. 3g, source contact mask 58 is deposited over the top surface of die 5. Source contact mask 58 is formed by, for example, photolithography and etching to provide openings that identify positions for electrical contact between source contact 28 (see FIG. 1b) and die 5. Low temperature oxide 24 layer at the bottom of each opening in contact mask 58 is etched to expose a contact region on the top surface of die 5, which is then highly doped with dopants of the same polarity as those of channel region 12. The dopants are then driven in a diffusion drive to form highly doped contact regions 26. The formation of highly doped contact regions 26 is followed by the etch back of low temperature oxide 24 to expose source regions 20. Also, top portions of low temperature oxide 24 beneath contact mask 58 are etched back as shown in FIG. 3g. Thereafter, source contact 28 is deposited over the top surface of die 5 making electrical contact with source regions 20 and highly doped contact regions 26 as shown by FIG. 3h.

Next, as is well known, drain contact 30 is formed on the back surface of die 5. In addition to the foregoing steps, conventionally known steps may be carried out before or after the formation of source contact 28 to form a gate contact structure (not shown) on the top surface of die 5.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method for manufacturing a semiconductor device comprising:

providing a semiconductor die of a semiconductive material having a channel receiving layer of a first conductivity;

forming a layer of oxidation retardant material over said channel receiving layer;

removing a portion of said oxidation retardant material to expose said semiconductor die;

etching said exposed semiconductor die to form a termination recess around said oxidation retardant material remaining after said receiving step, said termination recess including a sidewall and a bottom;

forming an oxide on said sidewall and said bottom of said termination recess; and forming trenches in said channel receiving layer, after forming said oxide on said sidewall and said bottom of said termination recess.

2. A method according to claim 1, further comprising implanting channel dopants of a second conductivity in said channel receiving layer before forming said layer of oxidation retardant material; and diffusing said channel dopants after forming said layer of oxidation retardant material to form a channel region.

3. A method for manufacturing a semiconductor device comprising:

providing a semiconductor die of a semiconductive material having a channel receiving layer of a first conductivity;

forming a layer of oxidation retardant material over said channel receiving layer;

forming trenches in said channel receiving layer in one region of said channel receiving layer;

forming a termination recess around said trenches said termination recess having exposed surfaces of semiconductive material;

forming another layer of oxidation retardant material over sidewalls and bottom of each of said trenches;

growing an oxide layer on exposed surfaces of said termination recess; implanting channel dopants of a second conductivity in said channel receiving layer before forming said layer of oxidation retardant material; and diffusing said channel dopants after forming said layer of oxidation retardant material to form a channel region;

removing oxidation retardant material from bottoms of said trenches leaving oxidation retardant material on said sidewalls of said trenches; forming a bottom oxide layer at said bottom of said trenches; removing said oxidation retardant material from said sidewalls of said trenches; and forming a layer of gate oxide on said sidewalls of said trenches; wherein said bottom oxide layer is thicker than said gate oxide layer.

4. A method according to claim 3, further comprising forming a gate electrode in each of said trenches; forming an insulation layer over said gate electrodes; and implanting dopants of said first conductivity in said channel region.

5. A method according to claim 4, wherein said gate electrodes are formed by depositing a layer of gate electrode material to at least fill said trenches and extend over said oxide layer in said termination recess; removing said gate electrode material to leave gate electrode material only in the interior of said trenches without removing gate electrode material disposed over said termination recess.

6. A method according to claim 4, further comprising forming a layer of low temperature oxide over said trenches and said termination recess; patterning said layer of low temperature oxide with openings that extend to said semiconductor die and leaving low temperature oxide over said gate electrodes; and driving said dopants of said first conductivity to form conductive regions of said first conductivity adjacent said trenches.

7. A method according to claim 6, wherein said patterning includes forming a mask having mask openings over said low temperature oxide to identify regions in said low temperature oxide which will be removed to form openings in said low temperature oxide; and comprising laterally removing portions of said low temperature oxide below said mask openings and then vertically removing low temperature oxide to create said openings, whereby said openings in said low temperature oxide will be narrower adjacent said semiconductor die.

8. A method according to claim 6, further comprising forming a contact layer that extends to and makes electrical contact with said conductive regions of said first conductivity adjacent said trenches.

9. A method according to claim 6, wherein said openings expose said channel region.

10. A method according to claim 9, further comprising implanting dopants of said second conductivity type in said channel region exposed by said openings to increase the concentration of dopants thereof.

11. A method according to claim 9, further comprising removing a portion of said semiconductor die at the bottom of each opening to create depression that exposed said channel region.

12. A method according to claim 11, further comprising implanting dopants of said second conductivity type in said channel region exposed by said openings to increase the concentration of dopants thereof.

13. A method according to claim 1, wherein said oxidation retardant material is a nitride.

14. A method according to claim 1, wherein said channel receiving layer is an epitaxial layer of first conductivity formed over a monolithic substrate of said first conductivity.

15. A method according to claim 1, wherein said semiconductor device is a MOSFET.

16. A method for manufacturing a MOSgated semiconductor switching device, comprising:

providing a semiconductor die having a channel receiving region of first conductivity;

forming a channel region of second conductivity in said channel receiving region;

forming at least one trench in said semiconductor die extending through said channel region;

forming a gate structure in said at least one trench; and forming a conductive region of said first conductivity type adjacent each side of said trench in said channel region after forming said gate structure; and forming a low temperature oxide body over all of said gate structure, and at least a portion of said conductive region; and forming recesses on a top portion of said low temperature oxide body.

17. A method according to claim 16, wherein said forming said conductive region comprises implanting dopants of said first conductivity in said channel region; applying a contact mask for forming a metal contact over said semiconductor die to serve as external connection for said conductive region; etching a depression through said conductive region to reach said channel region using said mask; implanting dopants of said second conductivity at the bottom of said depression, and diffusing said dopants of said first conductivity in a diffusion drive to form said conductive regions.

18. A method according to claim 16, further comprising forming a layer of oxidation retardant material on said sidewalls of said at least one trench, and forming a thick oxide at the bottom of said trench.

19. A method according to claim 16, further comprising forming a termination structure in said semiconductor die, said termination structure including a recess formed in said semiconductor die.

20. A method according to claim 16, wherein said gate structure includes a gate electrode insulated from said trench sidewalls by an insulation layer, wherein said insulation layer is formed by thermal oxidation before forming said conductive regions.

* * * * *